(12) United States Patent
Raravikar et al.

(10) Patent No.: US 7,553,681 B2
(45) Date of Patent: Jun. 30, 2009

(54) CARBON NANOTUBE-BASED STRESS SENSOR

(75) Inventors: Nachiket R. Raravikar, Chandler, AZ (US); Neha M. Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 487 days.

(21) Appl. No.: 11/388,828

(22) Filed: Mar. 24, 2006

(65) Prior Publication Data

US 2007/0222472 A1  Sep. 27, 2007

(51) Int. Cl.
*H01L 21/66* (2006.01)

(52) U.S. Cl. ............... 438/15; 257/48; 257/E21.521; 977/701; 977/707; 977/762; 977/778

(58) Field of Classification Search .......... 257/48; 977/701, 707, 762, 778; 438/14, 15, 17
See application file for complete search history.

(56) References Cited

U.S. PATENT DOCUMENTS

| 7,126,266 | B2 * | 10/2006 | Park et al. ............ 313/495 |
| 2005/0126766 | A1 * | 6/2005 | Lee et al. ............ 165/133 |
| 2006/0214192 | A1 * | 9/2006 | Nanai et al. ........... 257/213 |

OTHER PUBLICATIONS

Zhiling Li, "Carbon Nanotube Film Sensors", Advanced Materials, 2004, vol. 16, No. 7, pp. 640-643, Apr. 5, 2004.
Louis Liu, "Organic Flip Chip Packaging Design and Manufacturing Challenges", pp. 263-266.
Nachiket R. Raravikar, "Synthesis and Characterization of Thickness-Aligned Carbon Nanotube—Polymer Composite Films", Chemical Materials, 2005, vol. 17, pp. 974-983.
Jeffrey C. Suhling, "Silicon Pieoresistive Stress Sensors and Their Application in Electronic Packaging", IEEE Sensors Journal, vol. 1, No. 1, Jun. 2001.
Dongmok Whang, "Larg-Scale Hierarchical Organization of Nanowire Arrays for Integrated Nanosystems", Nano Letters, 2003, No. 9, pp. 1255-1259.

* cited by examiner

*Primary Examiner*—Wai-Sing Louie
(74) *Attorney, Agent, or Firm*—Blakely, Sokoloff, Taylor & Zafman LLP

(57) ABSTRACT

An embodiment of the present invention is a technique to form stress sensors on a package in situ. A first array of carbon nanotubes (CNTs) aligned in a first orientation is deposited at a first location on a substrate or a die in a wafer. The first array is intercalated with polymer. The first polymer-intercalated array is covered with a protective layer. A second array of CNTs aligned in a second orientation is deposited at a second location on the substrate or the die. The second array is intercalated with polymer.

12 Claims, 6 Drawing Sheets

CARBON NANOTUBE-BASED STRESS SENSOR

BACKGROUND

1. Field of the Invention

Embodiments of the invention relate to the field of nanotechnology, and more specifically, to carbon nanotubes.

2. Description of Related Art

Mechanical and structural reliability in semiconductor packages have become important due to increased circuit densities, power dissipation, and die size. One factor in packaging reliability is the stresses caused by mismatches between the coefficients of thermal expansion (CTEs) of the package and the semiconductor die. High level of heat dissipation and the mechanical loadings of the package mounted on a circuit board are additional sources of these stresses. It is, therefore, useful to have sensors that may measure the stress level on the packages.

Existing techniques for sensing stresses on packages have a number of disadvantages. One technique uses strain gauges to measure strain. These gauges are usually cemented on the package. This technique may lead to damage to the element or elements to which the gauges are cemented. Another technique uses silicon piezo-resistive stress sensors integrated with the process flow. This technique has not been mature enough for semiconductor packaging. Currently, there is no technique to measure the build-up of in-situ stress or state of stress in a package without destructive testing.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to form stress sensors on a package or die in situ. A first array of carbon nanotubes (CNTs) aligned in a first orientation is deposited at a first location on a substrate or a die in a wafer. The first array is intercalated with polymer. The first polymer-intercalated array is covered with a protective layer. A second array of CNTs aligned in a second orientation is deposited at a second location on the substrate or the die. The second array is intercalated with polymer. The first and second polymer-intercalated arrays of CNTs form stress sensors.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to fabricate stress sensors on a substrate or a die. The technique is a novel method to integrate a stress sensor into a micro-electronic package, to fabricate the stress sensor, and to fabricate or package a micro-electronic device having the stress sensors. The stress sensors are mechanically rigid and easy to handle so that they can be easily integrated into a package at desired locations. The stress sensors have high sensitivity, high spatial resolution, and the ability to resolve components of stresses by taking advantage of the anistropy of the nanotubes. The nanotubes or nanofibers may be deposited on substrates such as silicon in a desired orientation. The pristine carbon nanotube networks or arrays have low mechanical strength due to the weak Van der Waals interaction between the nanotubes. By intercalating the nanotube network or array with polymer, the mechanical strength of the network or array may be increased several folds. The intercalation of the polymer into the nanotube arrays may be performed by precipitating the polymer from a solution or by infiltrating a mixture of uncured resin or monomer, followed by in-situ polymerization. The infiltration of monomer or polymer is driven by the capillary forces which are a strong function of the wetting of the nanotube surface by the polymer and the viscosity of the solution.

Figure 1:
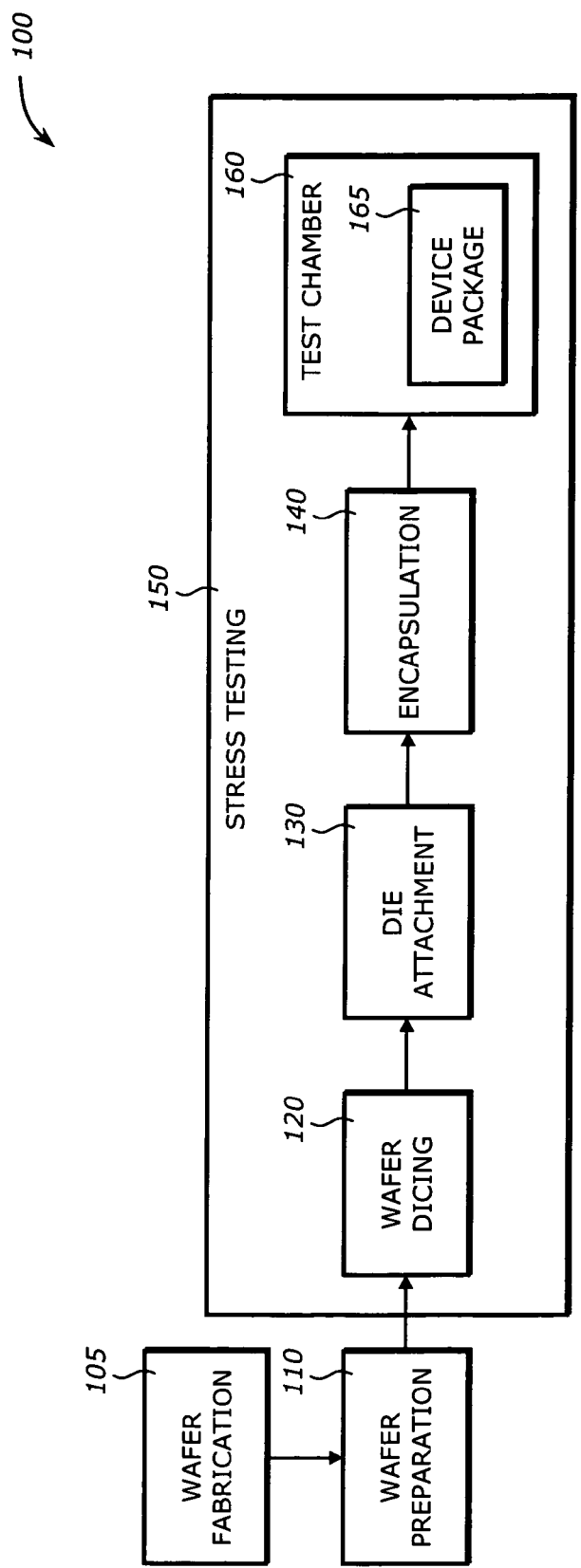
FIG. 1 is a diagram illustrating a system in which one embodiment of the invention can be practiced.

FIG. 1 is a diagram illustrating a system 100 in which one embodiment of the invention can be practiced. The system 100 includes a wafer fabrication phase 105, wafer preparation phase 110, a wafer dicing phase 120, a die attachment phase 130, an encapsulation phase 140, and a stress testing phase 150. The system 100 represents a manufacturing flow of a semiconductor packaging process.

The wafer fabrication phase 105 fabricates the wafer containing a number of dice. The individual dice may be any microelectronic devices such as microprocessors, memory devices, interface circuits, etc. Each die may have stress sensors to provide stress measurements in the stress testing phase 150. The wafer fabrication phase 105 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material. During this phase, stress sensors are strategically fabricated in each die together with the fabrication process for the circuit of the device. The stress sensors may also be incorporated onto the die, after the silicon fabrication.

The wafer preparation phase 110 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 120 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The die attachment phase 130 attaches the die to a package substrate. The substrate material depends on the packaging type. It may be lead-frame, plastic, or epoxy. During this phase, stress sensors may also be fabricated on the substrate to provide additional stress measuring means.

The encapsulation phase 140 encapsulates the die and the substrate. Depending on the packaging type, this may include molding, wire bonding, and solder ball attachment. Underfill material may be dispensed between the die and the substrate. Integrated heat spreader (IHS) may be attached to the die and substrate assembly. The encapsulated assembly of the die and substrate becomes a device package 165 ready to be tested.

The stress testing phase 150 may occur during the assembly process, in between the assembly stages, as well as after the assembly process-post-reliability tests. It may occur during the wafer dicing phase 120, the die attachment phase 130, the encapsulation phase 140, and in a test chamber 160. The stress testing phase 150 performs one or more tests such as Highly Accelerated Stress Test (HAST) or biased-HAST on the device package under stress conditions. The test chamber 160 may be designed to conduct a stress test. It may have monitoring circuits, measurement circuits, and other data processing equipment. The package 165 is placed in the test chamber 160 subject to the stress test. It may be powered or non-powered. Various stress tests may be performed on the wafer or on the packaged devices 165 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, accelerated moisture resistance. In the HBM ESD tests, the packaged devices or parts are exposed to very high voltage discharge levels (e.g., 250 V, 500V, or 1000V). The HTOL test attempts to expose oxide contamination, pin holes, and photo-masking defects. In the HTOL test, the parts may be exposed to high temperature (e.g., 125° C.) for an extended period (e.g., 1000 hours) while the supply voltage is biased to some specified level (e.g., 3.3V) and some input pins may be exposed to low frequency square wave. In thermal shock testing, the parts may be exposed to a temperature range from −55° C. to +125° C. for hundreds of cycles. In temperature cycling testing, the parts may be exposed to temperatures from −65° C. to +150° C. for hundreds or thousands of cycles with a rate of temperature change in the order of 30° C./minute. In high temperature storage testing, the parts may be exposed to a constant high temperature (e.g., +150° C.) for an extended period (e.g., 1000 hours). In vibration and mechanical loading, the parts may be exposed to high level of vibration to detect wear-out of solder joints. The shear testing checks bump integrity and to determine the adhesion of the under bump metallurgy (UBM) to the chip or degradation of solder. The accelerated moisture resistance testing attempts to uncover weaknesses such as delamination and metallization corrosion. The test may be performed to accelerate moisture penetration through the external protective material such as encapsulant or seal.

Figure 2:
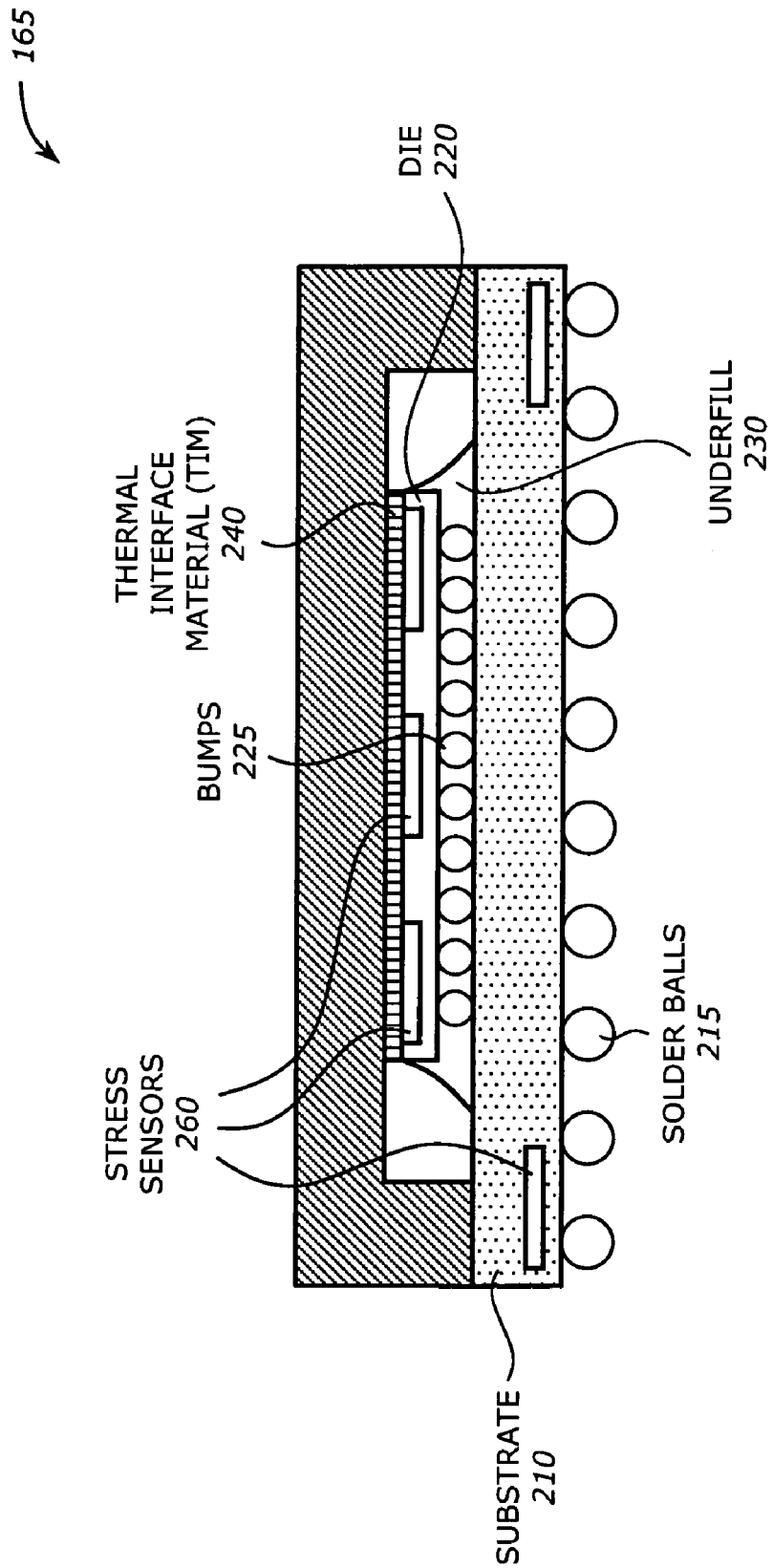
FIG. 2 is a diagram illustrating a package device according to one embodiment of the invention.

FIG. 2 is a diagram illustrating the package device 165 shown in FIG. 1 according to one embodiment of the invention. The package device 165 includes a substrate 210, a die 220, an underfill 230, a thermal interface material (TIM) 240, an integral heat spreader (IHS) 250, and stress sensors 260.

The substrate 210 is a package substrate that provides support for the die 220. The substrate 210 may be polymer or a composite. The substrate 210 may be attached to a number of solder balls 215. The solder balls 215 allow attachment of the package device 165 to a circuit board or to any other mounting component. The die 220 is any semiconductor die. It may have a microelectronic device such as a microprocessor, a memory, an interface chip, an integrated circuit, etc. The die 220 is attached to the substrate 110 by a number of solder bumps 225. The bumps 225 provide contact with the contact pads on the substrate. The bumps 225 may be fabricated using any standard manufacturing or fabrication techniques such as the controlled collapse chip connect (C4) technique. The underfill 230 is dispensed between die 220 and the substrate 210 to strengthen the attachment of die 220 to the substrate 210 to help prevent the thermal stresses from breaking the connections between die 220 and the substrate 210. The stresses may be caused by the difference between the coefficients of thermal expansion of die 220 and the substrate 210. The underfill 230 may contain filler particles suspended in an organic resin. The size of the filler particles are typically selected according to a gap between the die 220 and the substrate 210, e.g., the filler particles have a diameter about one third the size of the gap. Generally, the composition and concentration of filler particles are selected to control the coefficient of thermal expansion and the shrinkage of underfill 230.

The IHS 250 may house or cover the die 220 on the substrate 210. It may include a flat surface and supporting walls on both or four sides of the die 220. During operation, the die 220 may generate heat. The heat may be transferred to the IHS 250 through the TIM 240. The TIM 240 may be located, or interposed, between the bottom surface of the IHS 250 and the top surface of the die 220. It may be attached to a heat generating device, such as the die 220, to transfer the heat to a heat spreader or a heat sink or any another heat dissipating device. The TIM 240 may be made of thermal grease, phase change material (PCM) pads, films, and gels, or any thermally conducting material such as Sn solder, or tungsten, or a combination of such materials, which also show good adhesion (e.g., wetting) with the IHS 250 and the die 220.

The stress sensors 260 include a mat of CNTs intercalated with polymer. The CNT mat has aligned CNTs and is used to provide the piezoresistive response to make the sensors strain or stress sensitive. They may be located on the die 220 or the substrate 210 at various strategic locations. The stress sensors 260 form a thin film that may be deposited on back side or passive side of the die 220 during the die manufacturing phase. They may also be deposited on various regions on the substrate 210 during the substrate fabrication process. These regions may include a fillet region, a keep-out zone/region, and a region proximal to a core or via region on the substrate. The fillet region may be a region where the thickness of the underfill 230 is less than the diameter of a filler particle. The die 220 or the substrate 210 may not dissolve in various solvents used in the fabrication of the stress sensors 260.

The strategic locations or regions on which the stress sensors 260 are deposited or attached are responsive to stresses or strains caused by various types of tests. These tests may include any one of the above described tests. Specifically, they may include the die edge stress during thermal cycling, the TIM strain during thermal cycling and HAST, the inter-level dielectric (ILD) or UBM stress under a single solder ball, the single substrate via stress during thermal cycling and HAST, the scalable link interface (SLI) stress during shock and vibration, the UF stress at stress singularities, and the FLI stress during processing.

The package device 165 allows measurements of the stress experienced by the stress sensor 260 using the resistance of the nanotubes. The stress sensors 260 also allow measurement of the directionality of the stress at a given location using the directional properties of the nanotubes. This may lead to resolving components of stress and allowing calculating the state of stress at a given location. The film containing the stress sensors 260 has a certain average resistance across the entire membrane that is a function of its geometry. As the film experiences change in strain or stress within the package due to temperature or pressure, its resistance changes according to the piezo-resistive response. This is consistent with the Raman spectral shifts with the applied strain. By using the nanotubes in a controlled orientation in a two-dimensional plane, coupled with the resistance measurement as a function of stress, the stress components at a given location in the package device 165 may be determined according to the following equation:

$$\Delta R/R = K\epsilon \quad (1)$$

where R is the resistance, $\epsilon$ is the stress component, and K is a gauge factor calibrated for a particular thin film.

Figure 3:
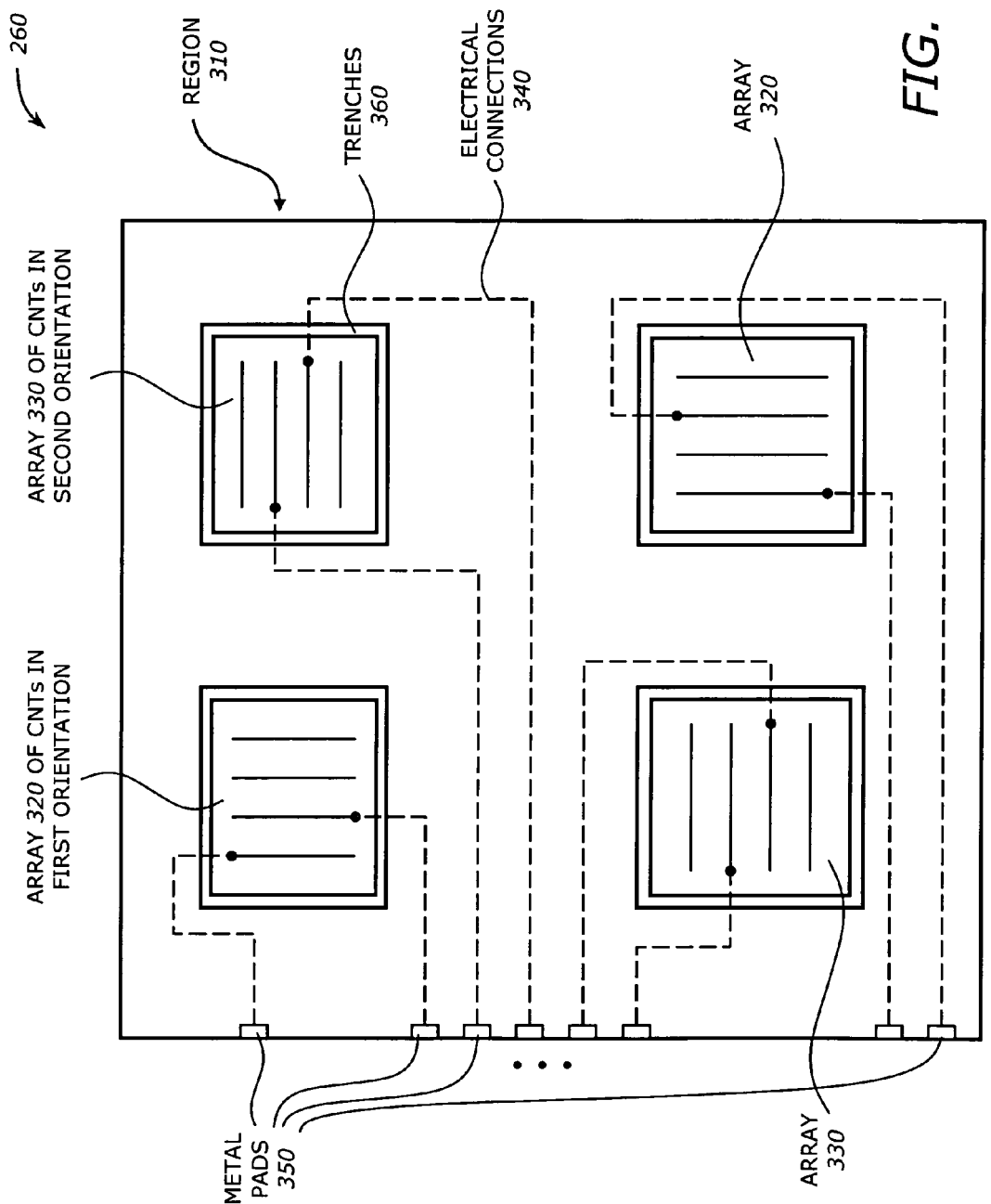
FIG. 3 is a diagram illustrating a thin film of stress sensors according to one embodiment of the invention.

FIG. 3 is a diagram illustrating a thin film of stress sensors 260 according to one embodiment of the invention. The stress sensors 260 may be located at a location or region 310. The stress sensors 260 include at least a first array 320 and a second array 330. Multiple arrays similar to the first and second array 320 and 330 may be formed at various locations or regions on the substrate or the die.

The first array 320 is an array of polymer-intercalated CNTs aligned in a first orientation at a first location on the substrate 210 or the die 220. The second array 330 is an array of polymer-intercalated CNTs aligned in a second orientation at a second location on the substrate 210 or the die 220. The first and second orientations are approximately perpendicular to each other. By having two different orientations or directions, the sensors may provide directionality. The CNTs oriented in the direction of application of stress shows the highest response to the stress component. The intercalating polymer is used to improve the adhesion between the CNTs and to provide the load transfer to the CNTs upon application of stress. The intercalating polymer may be with or without nano-particles based on the CTE requirements. Typically, polymer filled with nano-particles may have a lower CTH than polymer without nano-particles.

At least one of the first and second arrays 320 and 330 has a thickness of approximately between 15 μm (or microns) to 100 μm and occupies an area of approximately 50 μm×50 μm. The size of the CNTs is typically small. For example, the multi-walled nanotubes (MWNT) may have approximately 10 to 30 nm in diameter and a few tens of microns in length. The small size of the nanotubes is useful for scalability. The first and second arrays 320 and 330 may be surrounded by thin trenches 360. These trenches are etched around the CNT arrays to prevent the flow of the polymer during the sensor fabrication.

The first and second arrays 320 and 330 have electrical connections 340 to connect the ends of the nanotubes to metal pads, or electrodes, 350. The metal pads 350 may be screen printed on the substrate 210 or the die 220 to connect the nanotube arrays 320 and 330 to external circuits such as monitoring or testing circuits.

Figure 4:
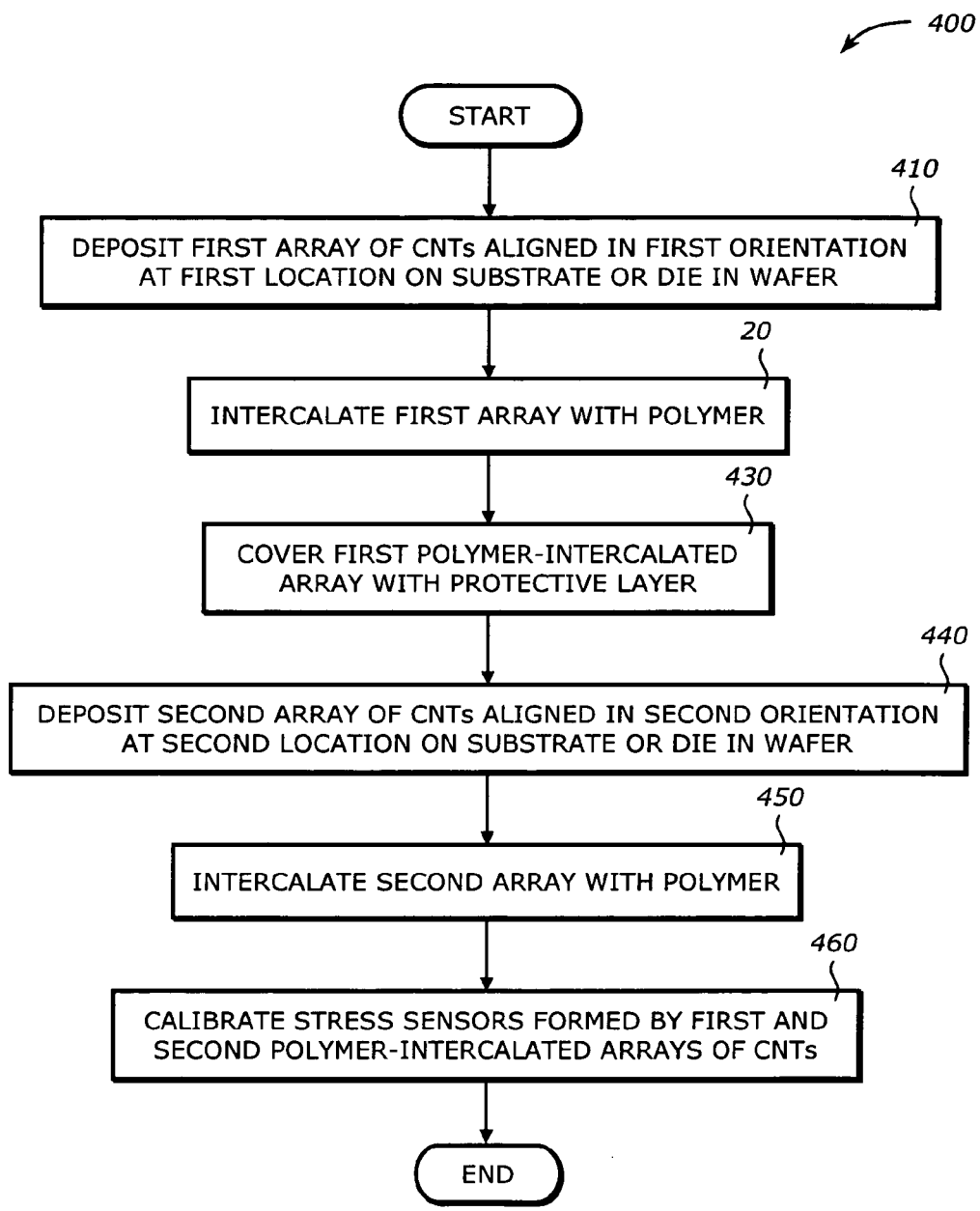
FIG. 4 is a flowchart illustrating a process to fabricate the stress sensors according to one embodiment of the invention.

FIG. 4 is a flowchart illustrating a process 400 to fabricate the stress sensors according to one embodiment of the invention.

Upon START, the process 400 deposits a first array of CNTs aligned in a first orientation at a first location on a substrate or a die in a wafer (Block 410). The first location is typically a desired location on the substrate or the die as discussed above. Multiple locations may be used for multiple first arrays. Next, the process 400 intercalates the first array with polymer (Block 420). Then, the process 400 covering the first polymer-intercalated array with a protective layer (Block 430). The protective layer may be a nitride layer. It serves to prevent the first array from being damaged or etched away in the next operation.

Next, the process 400 deposits a second array of CNTs aligned in a second orientation at a second location on the substrate or the die (Block 440). The second location is also a desired location on the substrate or the die that is different than the first location. The second orientation is different than the first orientation. Typically, it is at a direction that may have significant difference in stress response. It may form any desired angle with the first orientation. In one embodiment, the second orientation is approximately perpendicular to the first orientation. Multiple locations may be used for multiple second arrays. Then, the process 400 intercalates the second array with polymer (Block 450). Next, the process 400 calibrates stress sensors formed by the first and second polymer-intercalated arrays of CNTs (Block 460) and is then terminated.

Figure 5:
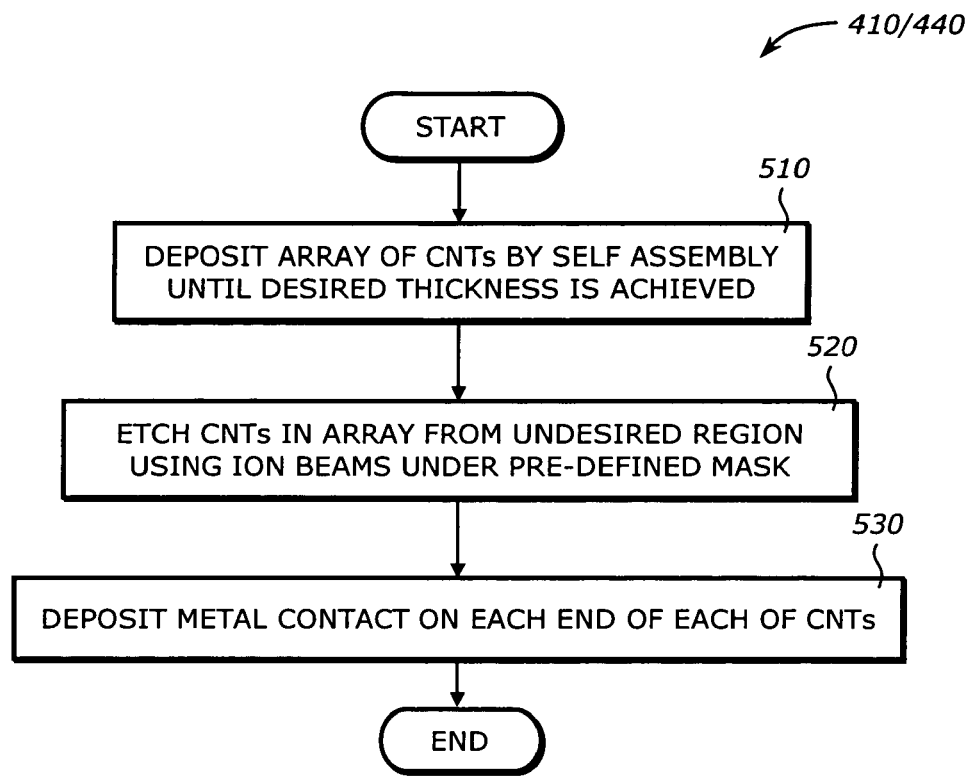
FIG. 5 is a flowchart illustrating a process to deposit an array of CNTs according to one embodiment of the invention.

FIG. 5 is a flowchart illustrating a process 410/440 to deposit an array of CNTs according to one embodiment of the invention. The processes 410 and 440 are similar except that the first and the second orientations and the first and second locations are different.

Upon START, the process 410/440 deposits the array of CNTs by self assembly until a desired thickness is achieved (Block 510). Multiple depositions of the CNTs in the desired orientation may be performed until the desired thickness is achieved. Self-assembly techniques such as Langmuir-Blodgett method may be employed. Then, the process 410/440 etches the CNTs in the array from an undesired region using ion beam under a pre-patterned mask (Block 520). The pre-patterned mask is designed such that only nanotubes in the desired location(s) or region(s) are retained while those outside the desired regions are etched away. During the etching of the second array, the nitride layer or coating protects the first array from being etched. Next, the process 410/440 deposits metal contact on each end of each of the CNTs (Block 530). The process 410/440 is then terminated.

Figure 6:
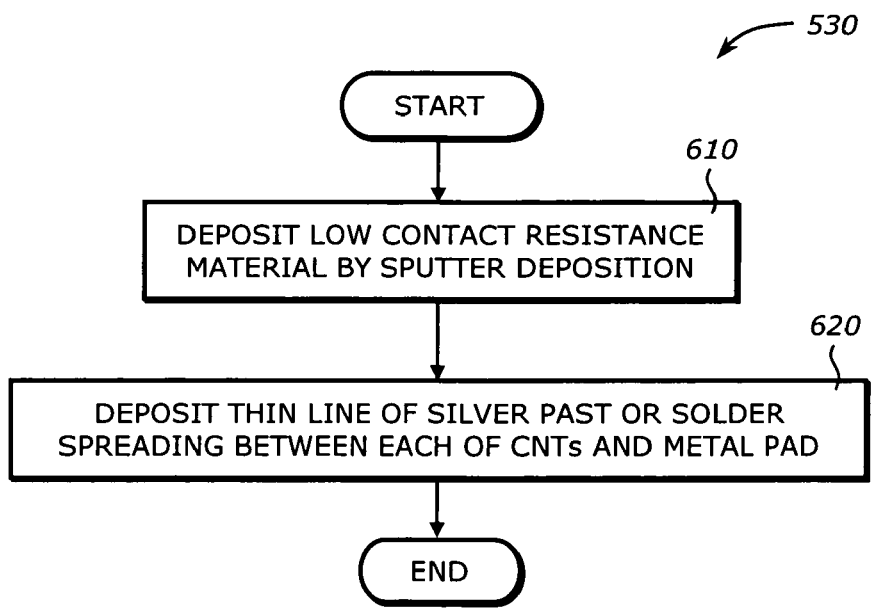
FIG. 6 is a flowchart illustrating a process to deposit the metal contact according to one embodiment of the invention.

FIG. 6 is a flowchart illustrating the process 530 to deposit the metal contact shown in FIG. 5 according to one embodiment of the invention.

Upon START, the process 530 deposits a low contact resistance material by sputter deposition (Block 610). Examples of the low contact resistance material may include Titanium. Next, the process 530 deposits a thin line of silver paste or solder spreading between each of the CNTs and a metal pad (Block 620). The metal pad, or electrode, may be screen printed on the die or the substrate. This thin line serves as an electrical connection between the CNT and external circuits. For the second array, the metal pads may have been partially etched away during the patterning or etching of the first array. Therefore, they may be printed again to assure their continuity. The process 530 is then terminated.

Figure 7:
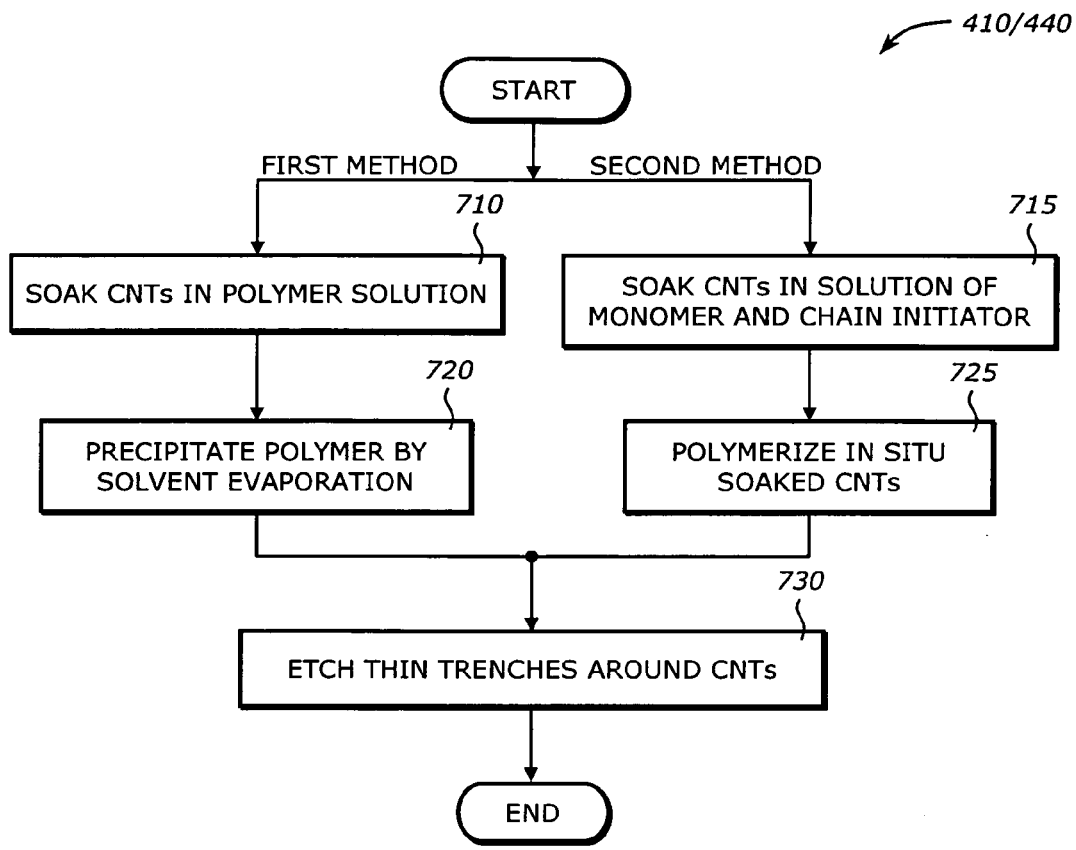
FIG. 7 is a flowchart illustrating a process to intercalate the array of CNTs according to one embodiment of the invention.

FIG. 7 is a flowchart illustrating the process 420/450 to intercalate the array of CNTs shown in FIG. 4 according to one embodiment of the invention. The processes 420 and 450 are essentially the same. There are two methods to perform this.

Upon START, in the first method, the process 420/450 soaks the CNTs in a polymer solution (Block 710). The polymer solution may be any one of a solution of polymethyl methacrylate, polysterene, and polycrabonate. Then, the process 420/450 precipitates polymer by solvent evaporation (Block 720). In the second method, the process 420/450 soaks the CNTs in a solution of a monomer and a chain initiator (Block 715). Then, the process 420/450 polymerizes in situ the soaked CNTs (Block 725). The soaking may be done by dispensing a few drops of the polymer solution or the monomer at the location of the nanotube array. The polymer solution or the monomer may be mixed with silica nanoparticles for reduction of CTE, according to the sensor application or requirements.

Next, for both methods, the process 420/450 etches a thin trench around the CNTs (Block 730). The thin trench serves to prevent the flow of the polymer or monomer solution. The process 420/450 is then terminated.

Figure 8:
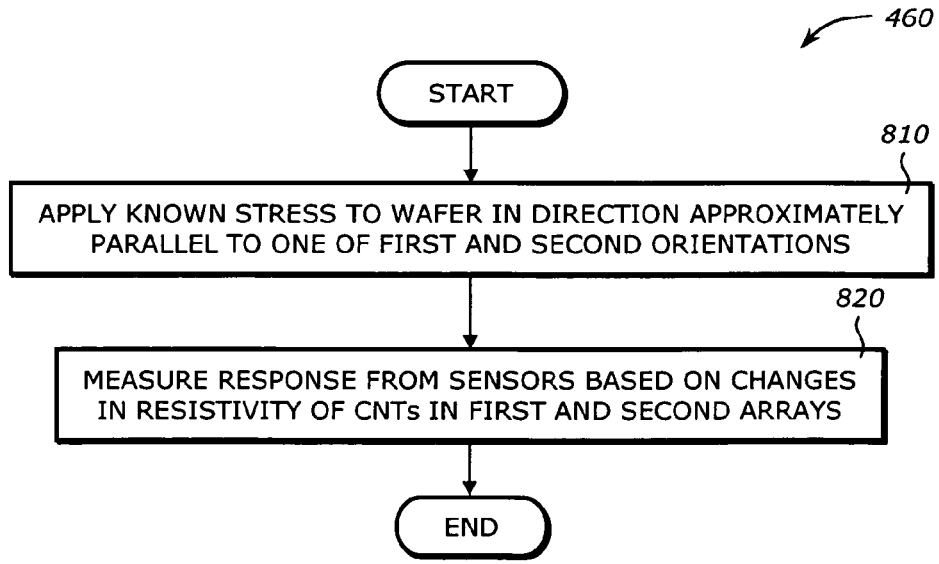
FIG. 8 is a flowchart illustrating a process to calibrate the stress sensors according to one embodiment of the invention.

FIG. 8 is a flowchart illustrating the process 460 to calibrate the stress sensors shown in FIG. 4 according to one embodiment of the invention. The calibration procedure is to obtain the directionality of the stress and calibration parameters such as the gauge factor K in equation (1).

Upon START, the process 460 applies a known stress to the wafer in a direction approximately parallel to one of the first and second orientations (Block 810). Next, the process 460 measures response from the sensors based on changes in resistivity of the CNTs in the first and second arrays (Block 820). The sensors in which the nanotubes are approximately parallel to the direction of the application of stress are expected to show larger changes in resistivity compared to the sensors having their nanotubes oriented in the direction that is perpendicular to the direction of the application of stress. This is because the response to the load transfer is different for different orientations. The known value of the stress and the changes in resistance may then be used to obtain the gauge factor K as shown in Equation (1). The process 460 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   depositing a first array of carbon nanotubes (CNTs) aligned in a first orientation at a first location on a substrate or a die in a wafer;
   intercalating the first array with polymer;
   covering the first polymer-intercalated array with a nitride layer;
   depositing a second array of CNTs aligned in a second orientation at a second location on the substrate or the die; and
   intercalating the second array with polymer.

2. The method of claim 1 further comprising:
   calibrating stress sensors formed by the first and second polymer-intercalated arrays of CNTs.

3. The method of claim 1 wherein depositing the first array comprises:
   depositing the first array of CNTs by self assembly until a desired thickness is achieved;
   etching the CNTs in the first array from an undesired region using ion beam under a pre-patterned mask; and
   depositing a metal contact on each end of each of the CNTs.

4. The method of claim 3 wherein depositing the metal contact comprises:
   depositing a low contact resistance material by sputter deposition; and
   depositing a thin line of silver paste or solder, the thin line spreading between the each of the CNTs and a metal pad.

5. The method of claim 1 wherein intercalating the first array comprises:
   soaking the CNTs in a polymer solution;
   precipitating polymer by solvent evaporation; and
   etching a thin trench around the CNTs.

6. The method of claim 1 wherein intercalating the first array comprises:
   soaking the CNTs in a solution of a monomer and a chain initiator;
   polymerizing in situ the soaked CNTs; and
   etching a thin trench around the CNTs.

7. The method of claim 1 wherein intercalating the second array comprises:
   soaking the CNTs in a polymer solution;
   precipitating polymer by solvent evaporation; and
   etching a thin trench around the CNTs.

8. The method of claim 1 wherein intercalating the second array comprises:
   soaking the CNTs in a solution of a monomer and a chain initiator;
   polymerizing in situ the soaked CNTs; and
   etching a thin trench around the CNTs.

9. The method of claim 1 wherein depositing the second array comprises:
   depositing the second array of CNTs by self assembly until a desired thickness is achieved;
   etching the CNTs in the second array from an undesired region using ion beam under a pre-patterned mask, the ion beam being prevented from etching the first array of CNTs; and
   depositing a metal contact on each end of each of the CNTs in the second array.

10. The method of claim 9 wherein depositing the metal contact comprises:
    depositing a low contact resistance material by sputter deposition; and
    depositing a thin line of silver paste or solder, the thin line spreading between the each of the CNTs and a metal pad.

11. The method of claim 1 wherein depositing the second array comprises:
    depositing the second array of CNTs aligned in the second orientation approximately perpendicular to the first orientation.

12. The method of claim 2 wherein calibrating comprises:
    applying a known stress to the wafer in a direction approximately parallel to one of the first and second orientations; and
    measuring response from the sensors based on changes in resistivity of the CNTs in the first and second arrays.

* * * * *